(12) United States Patent
Li et al.

(10) Patent No.: US 11,456,321 B2
(45) Date of Patent: Sep. 27, 2022

(54) METHOD FOR MANUFACTURING DISPLAY SUBSTRATE, DISPLAY SUBSTRATE AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yunze Li, Beijing (CN); Ni Yang, Beijing (CN); Xiaoyuan Wang, Beijing (CN); Xuefang Chen, Beijing (CN); Hui Li, Beijing (CN); Mengqiu Liu, Beijing (CN)

(73) Assignees: Chongqing BOE Optoelectronics Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 656 days.

(21) Appl. No.: 16/340,542

(22) PCT Filed: Aug. 14, 2018

(86) PCT No.: PCT/CN2018/100398
§ 371 (c)(1),
(2) Date: Apr. 9, 2019

(87) PCT Pub. No.: WO2019/144601
PCT Pub. Date: Aug. 1, 2019

(65) Prior Publication Data
US 2021/0327904 A1 Oct. 21, 2021

(30) Foreign Application Priority Data
Jan. 23, 2018 (CN) .......................... 201810063039.6

(51) Int. Cl.
*H01L 27/12* (2006.01)
*H01L 27/32* (2006.01)

(52) U.S. Cl.
CPC .......... *H01L 27/124* (2013.01); *H01L 27/127* (2013.01); *H01L 27/1248* (2013.01);
(Continued)

(58) Field of Classification Search
CPC ............... H01L 27/124; H01L 27/1248; H01L 27/3258; H01L 27/3279
See application file for complete search history.

(56) References Cited

U.S. PATENT DOCUMENTS

2001/0046016 A1  11/2001  Park et al.
2006/0038175 A1*  2/2006  Lai ................... G02F 1/136259
257/59
(Continued)

FOREIGN PATENT DOCUMENTS

CN  103296033 A  9/2013
CN  104216182 A  12/2014
(Continued)

OTHER PUBLICATIONS

First Office Action for Chinese Application No. 201810063039.6, dated Jun. 28, 2020, 8 Pages.
(Continued)

*Primary Examiner* — Peter M Albrecht
(74) *Attorney, Agent, or Firm* — Brooks Kushman P.C.

(57) ABSTRACT

A method for manufacturing a display substrate, a display substrate and a display device are provided. The method for manufacturing a display substrate includes: forming, on a base substrate, a concave-convex structure extending in a direction identical to an extending direction of a signal transmission line; and forming the signal transmission line on the concave-convex structure.

6 Claims, 5 Drawing Sheets

(52) U.S. Cl.
CPC ...... *H01L 27/3258* (2013.01); *H01L 27/3279* (2013.01); *H01L 2227/323* (2013.01)

(56) References Cited

U.S. PATENT DOCUMENTS

| | | |
|---|---|---|
| 2010/0271349 A1 | 10/2010 | Liu et al. |
| 2015/0318305 A1 | 11/2015 | Zhang et al. |
| 2015/0340389 A1 | 11/2015 | Liu et al. |
| 2016/0056178 A1 | 2/2016 | Ma |
| 2016/0342057 A1* | 11/2016 | Zhang ................ H01L 23/50 |

FOREIGN PATENT DOCUMENTS

| | | | |
|---|---|---|---|
| CN | 104617107 A | | 5/2015 |
| CN | 104733476 A | | 6/2015 |
| CN | 103390592 B | | 2/2016 |
| CN | 108281468 A | | 7/2018 |
| JP | 2010087527 A | | 4/2010 |
| KR | 20010009269 A | * | 2/2001 |
| KR | 20090070308 A | * | 7/2009 |

OTHER PUBLICATIONS

International Search Report and Written Opinion for Application No. PCT/CN2018/100398, dated Nov. 13, 2018, 10 Pages.

* cited by examiner

METHOD FOR MANUFACTURING DISPLAY SUBSTRATE, DISPLAY SUBSTRATE AND DISPLAY DEVICE

CROSS-REFERENCE TO RELATED APPLICATION

This application claims a priority to Chinese Patent Application No. 201810063039.6 filed on Jan. 23, 2018, the disclosure of which is incorporated in its entirety by reference herein.

TECHNICAL FIELD

The present disclosure relates to the field of display technology, particular to a method for manufacturing a display substrate, a display substrate and a display device.

BACKGROUND

In an active-matrix organic light emitting diode (AMOLED) display device, a driving circuit and OLEDs are combined, and a needed signal is written through a switching component to control a brightness of each pixel. With characteristics such as foldability, being light and thin, wide color gamut and being completely solid, the AMOLED display device is widely concerned and develops rapidly. When the AMOLED display device works, thin film transistors (TFTs) are controlled to be turned on through scanning lines, such that data signals are written, through the TFTs, into storage capacitors corresponding to pixel units; The data signals in cooperation with a common electrode and other TFT components control densities of currents flowing through the OLEDs, thereby enabling the OLEDs to display in different brightnesses. Therefore, as functional wires inside the display device, signal transmission lines for transmitting the data signals are necessary for achieving displaying function of the display device.

SUMMARY

A method for manufacturing a display substrate is provided, including: forming, on a base substrate, a concave-convex structure extending in a same direction with an extending direction of a signal transmission line; and forming the signal transmission line on the concave-convex structure.

In some embodiments, the forming, on the base substrate, the concave-convex structure extending in the same direction with the extending direction of the signal transmission line includes: forming an insulating layer; and etching the insulating layer to form a via-hole, where the concave-convex structure includes the via-hole penetrating the insulating layer. The forming the signal transmission line on the concave-convex structure includes: depositing a metallic thin film on the insulating layer having the via-hole; and patterning the metallic thin film to form the signal transmission line.

In some embodiments, before forming the insulating layer, the method for manufacturing the display substrate further includes: forming, on the base substrate, a complementary data line having a same extending direction with an extending direction of a data line. An orthographic projection of the complementary data line onto the base substrate at least partially overlaps an orthographic projection of the data line onto the base substrate, the complementary data line is connected to the data line via the via-hole, and the signal transmission line includes the data line.

In some embodiments, the forming, on the base substrate, the complementary data line having the same extending direction with the extending direction of the data line includes: forming the complementary data line and an active layer of a thin film transistor through one patterning process.

In some embodiments, the forming the complementary data line and the active layer of the thin film transistor through one patterning process includes: depositing a polysilicon layer; patterning the polysilicon layer to form the active layer of the thin film transistor and a transition pattern for forming the complementary data line; and performing heavy doping on the transition pattern, and a source electrode contact region and a drain electrode contact region of the active layer, where the heavily doped transition pattern forms the complementary data line.

In some embodiments, the etching the insulating layer to form the via-hole includes: forming the via-hole, and a source electrode via-hole and a drain electrode via-hole of the thin film transistor through one patterning process. The forming the signal transmission line on the concave-convex structure includes: forming the data line, and a source electrode and a drain electrode of the thin film transistor through one patterning process, where the source electrode is connected to the source electrode contact region via the source electrode via-hole, and the drain electrode is connected to the drain electrode contact region via the drain electrode via-hole.

In some embodiments, the method for manufacturing the display substrate further includes patterning the data line at a projection region of a scanning line of the display substrate onto the data line, to form a hollowed-out pattern in the data line at the projection region, where the scanning line intersects with the data line.

In some embodiments, the method for manufacturing the display substrate further includes patterning the complementary data line at a projection region of a scanning line of the display substrate onto the complementary data line, to form a hollowed-out pattern in the complementary data line at the projection region, where the scanning line intersects with the data line.

In some embodiments, the method for manufacturing the display substrate further includes: patterning the data line at a first projection region of a scanning line of the display substrate onto the data line, to form a hollowed-out pattern in the data line at the first projection region, where the scanning line intersects with the data line; and patterning the complementary data line at a second projection region of the scanning line of the display substrate onto the complementary data line, to form a hollowed-out pattern in the complementary data line at the second projection region.

A display substrate is provided, including: a base substrate, a concave-convex structure arranged on the base substrate, and a signal transmission line arranged on the concave-convex structure. An extending direction of the concave-convex structure is the same as an extending direction of the signal transmission line.

In some embodiments, the display substrate further includes an insulating layer. The concave-convex structure includes a via-hole penetrating the insulating layer, and the signal transmission line is located on the insulating layer.

In some embodiments, the display substrate further includes a complementary data line having a same extending direction with an extending direction of a data line. The signal transmission line includes the data line, an orthographic projection of the complementary data line onto the base substrate at least partially overlaps an orthographic projection of the data line onto the base substrate, and the complementary data line is connected to the data line via the via-hole.

In some embodiments, the display substrate further includes an active layer of a thin film transistor. The active layer is arranged in a same layer with the complementary data line, and each of the complementary data line, and a source electrode contact region and a drain electrode contact region of the active layer is a polysilicon thin film that is heavily doped.

In some embodiments, the display substrate further includes a scanning line. The scanning line intersects with the data line, there is a projection region of the scanning line projected onto the data line, and a hollowed-out pattern is arranged in the data line at the projection region.

In some embodiments, the display substrate further includes a scanning line. There is a projection region of the scanning line projected onto the complementary data line, and a hollowed-out pattern is formed in the complementary data line at the projection region.

In some embodiments, the display substrate further includes a scanning line. The scanning line intersects with the data line. There is a first projection region of the scanning line projected onto the data line, and a hollowed-out pattern is arranged in the data line at the first projection region. There is a second projection region of the scanning line projected onto the complementary data line, and a hollowed-out pattern is arranged in the complementary data line at the second projection region.

A display device is provided, including any of the above described display substrates.

REFERENCE SIGNS ARE DESCRIBED AS FOLLOWS

1: base substrate, 2: buffering layer, 3: active layer, 31: source electrode contact region, 32: drain electrode contact region, 4: first insulating layer, 5: gate electrode, 6: second insulating layer, 7: protective layer, 8: source electrode via-hole, 9: drain electrode via-hole, 10: data line, 11: source electrode, 12: drain electrode, 13: planarization layer, 14: anode, 15: pixel definition layer, 16: spacer layer, 17: via-hole, 18: complementary data line, 19: transition pattern, 20: hollowed-out pattern, 21: scanning line.

DETAILED DESCRIPTION

Figure 1:
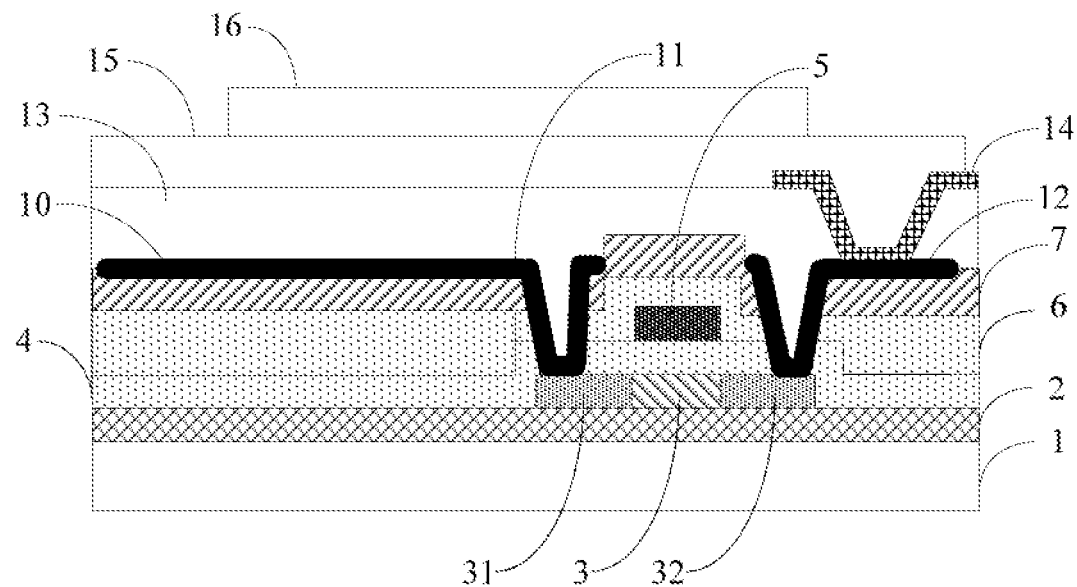
FIG. 1 is a schematic sectional view of a display substrate in relevant technology.
Figure 2:
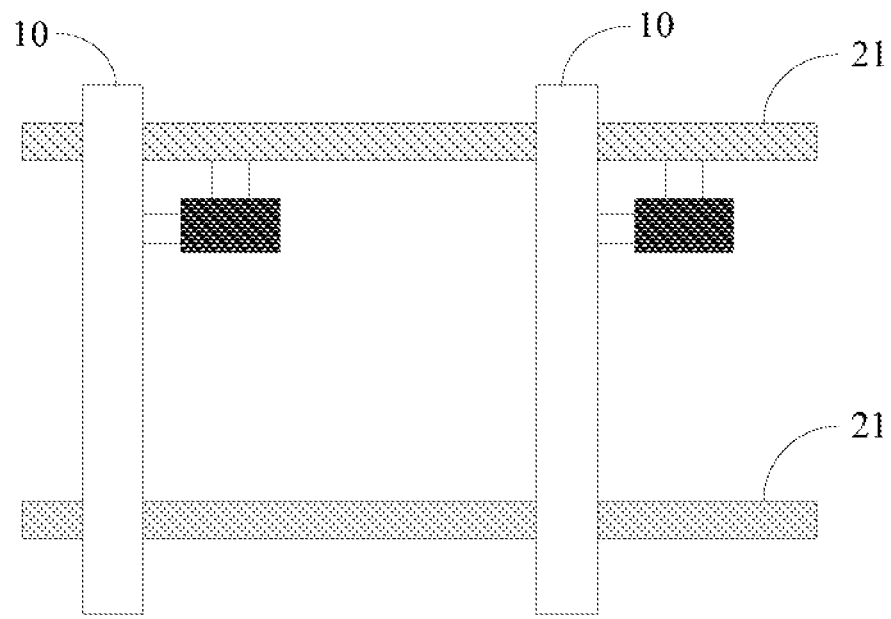
FIG. 2 is a top view of a display substrate in relevant technology.

As shown in FIG. 1 and FIG. 2, a display substrate in relevant technology includes a base substrate 1, a buffering layer 2, an active layer 3 (including a source electrode contact region 31 and a drain electrode contact region 32), a first insulating layer 4, a gate electrode 5, a second insulating layer 6, a protective layer 7, a source electrode via-hole and a drain electrode via-hole that penetrate the protective layer 7, the second insulating layer 6 and the first insulating layer 4, a data line 10, a source electrode 11 and a drain electrode 12. The data line 10 is connected with the source electrode 11. The source electrode 11 is connected to the source electrode contact region 31 via the source electrode via-hole. The drain electrode 12 is connected to the drain electrode contact region 32 via the drain electrode via-hole.

The display substrate further includes a planarization layer 13, an anode 14, a pixel definition layer 15 and a spacer layer 16.

In a structure of the display substrate shown in FIG. 1 and FIG. 2, the data line 10 is a single-layer data line. Such data line 10 may have a large resistance due to a large length and a limited width and a limited film thickness of the data line 10. In case of applying such single-layer data line in a large scale and high definition AMOLED product, increased voltage drop and time delay may be formed when a data signal is propagated along the data line 10 across a long distance; accordingly, an image at a far end of a display device may be displayed abnormally and the product quality may be adversely affected.

Figure 3:
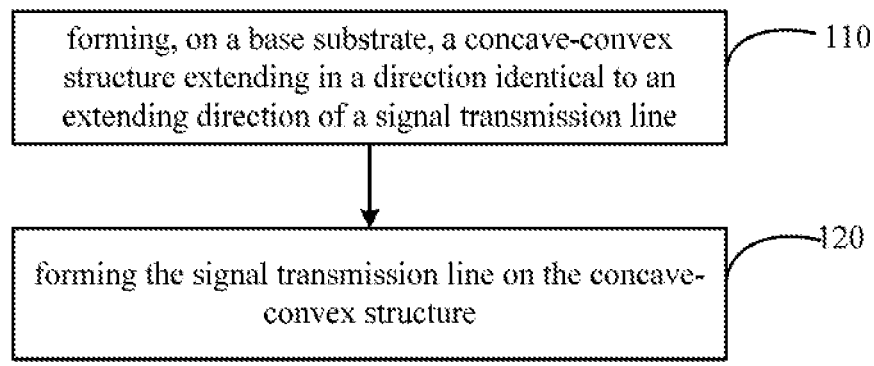
FIG. 3 is a flow chart of a method for manufacturing a display substrate according to some embodiments of the present disclosure.

A method for manufacturing a display substrate is provided according to some embodiments. As shown in FIG. 3, the manufacturing method includes step 110 and step 120.

Step 110 includes forming, on a base substrate, a concave-convex structure extending in a direction identical to an extending direction of a signal transmission line.

Step 120 includes forming the signal transmission line on the concave-convex structure.

It can be known from the above steps, in the method for manufacturing the display substrate according to the embodiments, since the signal transmission line is formed on the concave-convex structure extending in the direction identical to the extending direction of the signal transmission line, the signal transmission line has climbing portions. Since the climbing portions are also involved in signal transmission, the width of the signal transmission line is increased and the resistance of the signal transmission line is decreased.

With the above-described manufacturing method, the resistance of the signal transmission line is decreased, a voltage drop and a time delay generated when a signal is propagated along the data transmission line across a long distance are decreased, and consequently, abnormal image displaying at the far end of the display substrate is prevented.

With the above-described manufacturing method, the resistance of the signal transmission line is decreased, requirement on a driving capability of a driving chip in the display substrate is lowered, and power consumption of the display substrate is reduced.

In some embodiments, the concave-convex structure is a concave portion. In some embodiments, the concave-convex structure is a convex portion.

In some embodiments, the forming the concave-convex structure on the base substrate includes: depositing, on the base substrate, a film layer used to form the concave-convex structure and patterning the film layer using a patterning process to form the concave-convex structure extending in the direction identical to the extending direction of the signal transmission line.

In some embodiments, the forming the signal transmission line on the concave-convex structure includes: depositing a metallic thin film which covers the concave-convex structure and patterning the metallic thin film to form the signal transmission line on the concave-convex structure.

Figure 4:
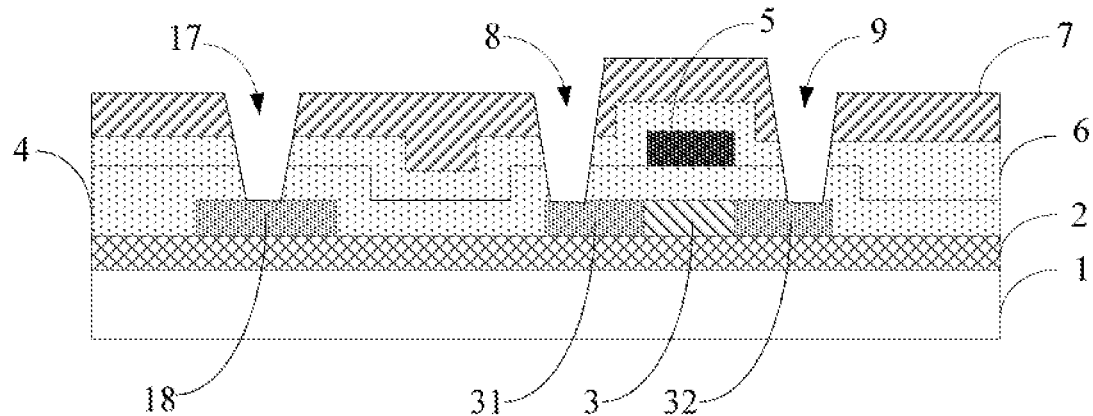
FIG. 4 schematically illustrates forming a via-hole in a display substrate according to some embodiments of the present disclosure.

In some embodiments, as shown in FIG. 4, the concave-convex structure includes a via-hole 17 that penetrates an insulating layer.

In some embodiments, a step of forming multiple concave-convex structures on the base substrate 1 includes: forming an insulating layer and etching the insulating layer to form the via-hole 17.

In some embodiments, the step of forming the multiple concave-convex structures on the base substrate 1 includes: forming the insulating layer on the base substrate; forming a photoresist on the insulating layer; exposing and developing the photoresist to form photoresist remaining regions and photoresist removing regions, where the photoresist removing regions correspond to regions where the via-holes 17 are located and the photoresist remaining regions correspond to regions in addition to the photoresist removing regions; and etching the insulating layer in the photoresist removing regions to form the via-hole 17.

In some embodiments, in a case that the concave-convex structure is the via-hole 17 penetrating the insulating layer, the above step for manufacturing the signal transmission line includes: depositing a metallic thin film on the insulating layer having the via-hole 17, where the metallic thin film covers the via-hole 17; and patterning the metallic thin film to form the signal transmission line.

In some embodiments, the insulating layer is an insulating thin film. In some embodiments, the insulating layer includes multiple layers of insulating thin films.

The deeper the via-hole 17 in the insulating layer is, the wider the data line 10 formed on the via-hole is, and the smaller the resistance of the data line 10 is.

In some embodiments, in the structure of the display substrate as shown in FIG. 4, the insulating layer includes a first insulating layer 4, a second insulating layer 6 and a protective layer 7. That is to say, the via-hole 17 is a via-hole penetrating the first insulating layer 4, the second insulating layer 6 and the protective layer 7.

The signal transmission line includes various signal lines.

In some embodiments, the signal transmission line includes the data line 10.

Figure 5:
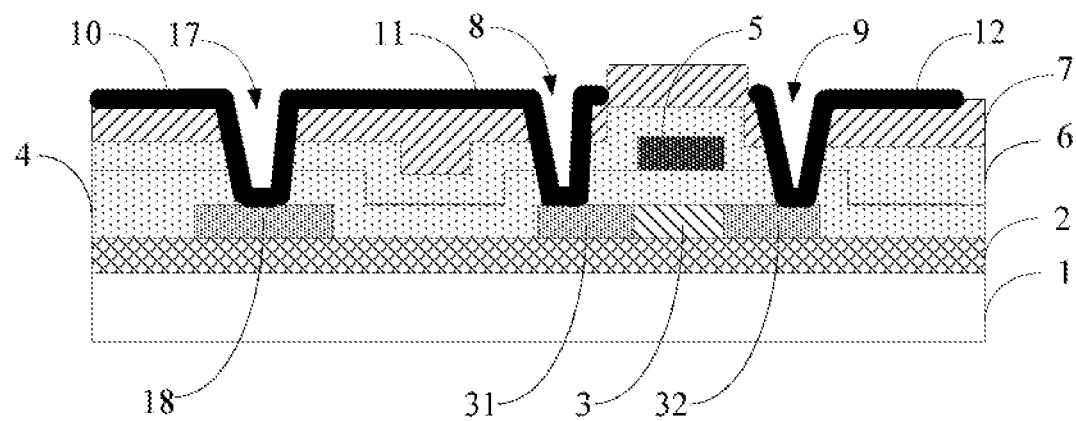
FIG. 5 schematically illustrates forming a data line in a display substrate according to some embodiments of the present disclosure.
Figure 7:
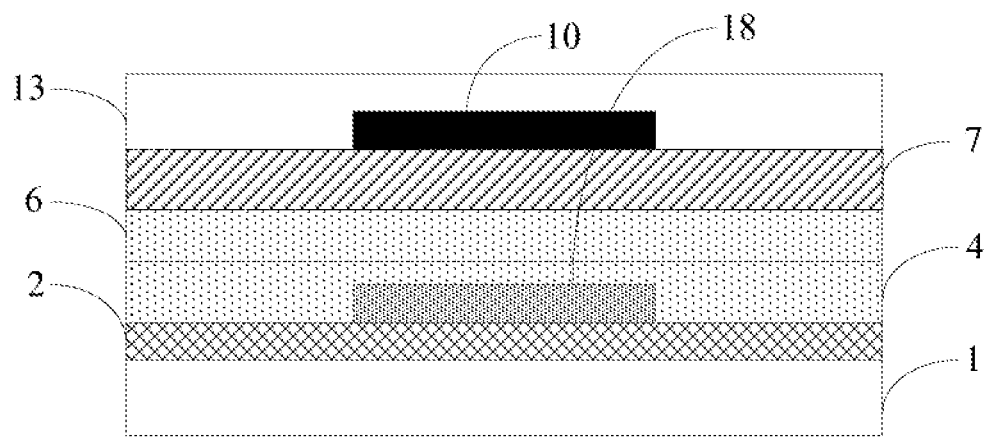
FIG. 7 is a schematic sectional view of the display substrate taken along A-A' in FIG. 6.
Figure 8:
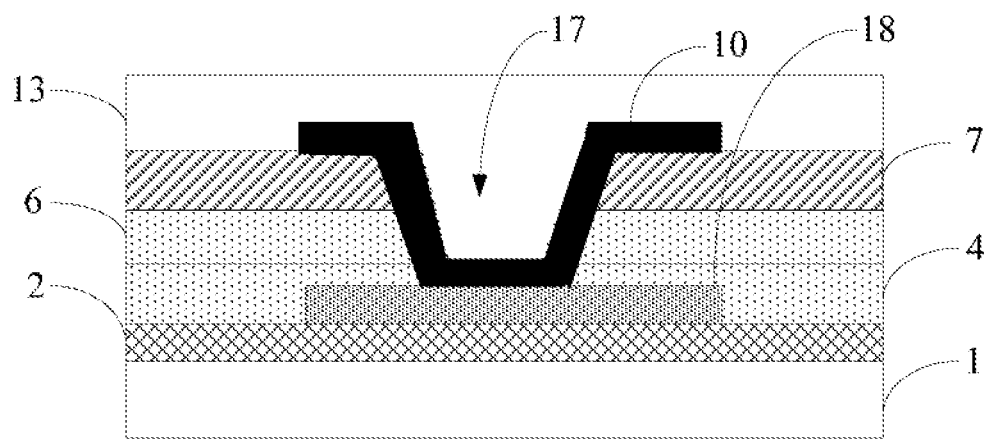
FIG. 8 is a schematic sectional view of the display substrate taken along B-B' in FIG. 6.

In some embodiments, before forming the insulating layer, the manufacturing method further includes: forming, on the base substrate 1, a complementary data line 18 having an extending direction identical to that of the data line 10. As shown in FIG. 5, FIG. 7 and FIG. 8, an orthographic projection of the complementary data line 18 onto the base substrate 1 at least partially overlaps an orthographic projection of the data line 10 onto the base substrate 1, and the complementary data line 18 is connected to the data line 10 via the via-hole 17.

By forming the complementary data line 18 having the extending direction identical to that of the data line 10 on the base substrate 1 and connecting the complementary data line 18 to the data line 10 via the via-hole 17, another data line in parallel with the data line 10 is equivalently added in the display substrate, thereby decreasing the resistance of the data line 10 and preventing abnormal image display at the far end of the display substrate. In a case that the data line 10 cracks (Data Open phenomenon) in an etching operation or in a climbing process, the data signal can be further propagated through the complementary data line 18 and the display substrate can still achieve a displaying function.

As shown in FIG. 1 and FIG. 2, in the structure of the display substrate in the relevant technology, the insulating layer is formed, on the gate electrode 5, and the data line 10, the source electrode 11 and the drain electrode 12 are formed on the insulating layer. An etching process is necessary to form the data line 10, the source electrode 11 and the drain electrode 12, such etching process may damage the insulating layer and a short circuit (Data Gate short) may be formed between the data line 10 and the gate electrode 5. In addition, a pattern of the formed gate electrode has a small area, the insulating layer formed on the gate electrode 5 may have a climbing portion at a periphery region of the pattern of the e electrode, the climbing portion of the insulating layer may easily crack in a manufacturing process of the insulating layer and subsequent processes, and consequently, the short circuit may be generated between the data line 10 and the gate electrode 5.

In the embodiments of the present disclosure, by arranging the complementary data line 18 in parallel with the data line 10, the data signal may be transmitted on the data line 10 and the complementary data line 18 simultaneously. Even when Data Gate short occurs between the data line 10 and the gate electrode 5, a portion of the data line 10 involved in the short circuit may be cut off and the data signal may be transmitted via the complementary data line 18, thereby improving the production yield of the display substrates.

In some embodiments, the step of forming the complementary data line in foregoing embodiments includes: forming the complementary data line 18 and an active layer 3 of a thin film transistor (TFT) of the display substrate through a single patterning process.

In the embodiments, the complementary data line 18 is arranged in a layer identical to the active layer 3 of an array substrate included in the display substrate and the complementary data line 18 and the active layer 3 can be formed through one patterning process, such that no additional patterning process is performed for forming the complementary data line 18.

Figure 11:
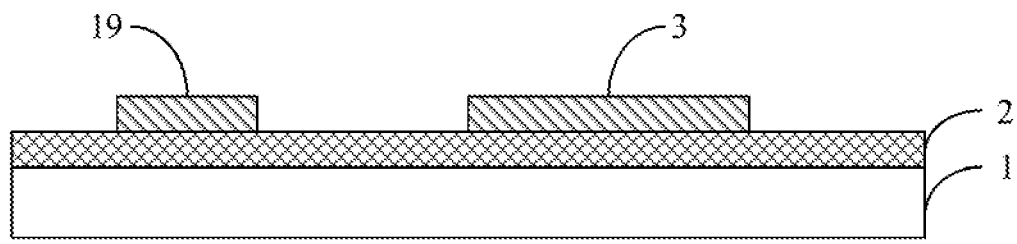
FIG. 11 schematically illustrates forming a transition pattern and a source electrode on a base substrate according to some embodiments of the present disclosure.

In some embodiments, a step of forming the complementary data line 18 and the active layer 3 of the TFT of the display substrate includes: depositing a polysilicon layer, and patterning the polysilicon layer to form the active layer 3 of the TFT and a transition pattern 19 for generating the complementary data line 18, as shown in FIG. 11.

In some embodiments, the depositing the polysilicon layer includes depositing a polysilicon material to form the polysilicon layer.

In some embodiments, the patterning the polysilicon layer includes: forming a photoresist on the polysilicon layer; exposing and developing the photoresist to form photoresist remaining regions and photoresist removing regions, where the photoresist remaining regions correspond to regions where the active layer 3 of the TFT and the transition pattern 19 for generating the complementary data line 18 are located, and the photoresist removing regions correspond to regions in addition to the photoresist remaining regions; removing the polysilicon layer in the photoresist removing regions through an etching process to form the active layer 3 of the TFT and the transition pattern 19 for generating the complementary data line 18; and peeling the photoresist in the photoresist remaining regions.

Figure 12:
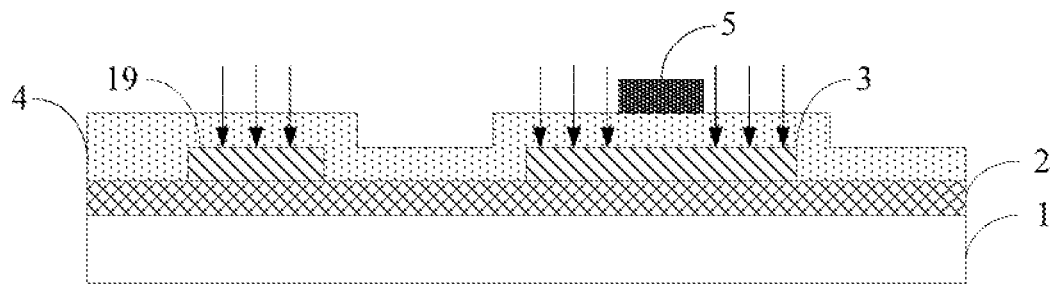
FIG. 12 schematically illustrates a heavy doping according to some embodiments of the present disclosure.

As shown in FIG. 12, after forming the transition pattern 19 and the active layer 3, the transition pattern 19, and a source electrode contact region 31 and a drain electrode contact region 32 of the active layer 3 are heavily doped simultaneously, and the heavily doped transition pattern 19 forms the complementary data lime 18.

To equip the formed complementary data line 18 with good conductivity and to make the active layer 3 better contact with the source electrode 11 and the drain electrode 12, the transition pattern 19, and the source electrode contact region 31 and the drain electrode contact region 32 of the active layer 3 may be heavily doped simultaneously. The heavily doped transition pattern 19 forms the complementary data line 18 having good conductivity. The heavily doped source electrode contact region 31 and drain electrode contact region 32 may achieve good electrical connections respectively to the source electrode 11 and the drain electrode 12.

In some embodiments, before performing a heavy doping, the first insulating layer 4 and the gate electrode 5 are formed on the transition pattern 19 and the active layer 3. As shown in FIG. 12, the gate electrode 5 shields a channel region of the active layer 3, thereby preventing adverse effects on the channel region due to the heavy doping.

In some embodiments, as shown in FIG. 4, etching the insulating layer to form the via-hole includes: forming the via-hole 17, and a source electrode via-hole 8 and a drain electrode via-hole 9 in the TFT through one patterning process.

The via-hole 17, and the source electrode via-hole 8 and the drain electrode via-hole 9 in the TFT may penetrate a same thin film layer, such that the via-hole 17 and the source electrode via-hole 8 and the drain electrode via-hole 9 in the TFT can be formed simultaneously through one patterning process, and thus no additional patterning process is necessary for forming the via-hole 17.

In some embodiments, as shown in FIG. 5, a step of forming the signal transmission line includes: forming the data line 10, and the source electrode 11 and the drain electrode 12 in the TFT through one patterning process, where the source electrode 11 is connected to the source electrode contact region 31 via the source electrode via-hole 8, and the drain electrode 12 is connected to the drain electrode contact region 32 via the drain electrode via-hole 9.

In some embodiments, the data line 10 is arranged at a layer identical to the source electrode 11 and the drain electrode 12 of the TFT. In this way, the data line 10 and the source electrode 11 and the drain electrode 12 of the TFT can be formed through one patterning process and no additional patterning process is necessary for forming the data line 10.

In the method for manufacturing the display substrate in the foregoing embodiments, the via-hole 17, and the source electrode via-hole 8 and the drain electrode via-hole 9 can be formed through one patterning process, the complementary data line 18 and the active layer 3 of the TFT can be formed through one patterning process, and the data line 10 can be connected to the complementary data line 18 via the via-hole 17. Hence, in the method tier manufacturing the display substrate in the foregoing embodiments, a structure of two layers of data lines in parallel is manufactured in the display substrate without increasing the quantity of patterning processes and the cost; the resistance of the data line and the power consumption of the display substrate are greatly reduced. In case of the data line cracking (Data open), the complementary data line 18 may continue transmitting the data signal, which prevents data signal transmission from being affected by Data open. In case of Data Gate short between the data line 10 and the gate electrode 5, the portion of data line involved in short circuit is cut off, and the complementary data line 18 continues transmitting the data signal, thereby recovering the data line and improving the yield of the display substrate.

Since the complementary data line 18 having the extending direction identical to that of the data line 10 is made in the display substrate, which introduces an overlapping region of the complementary data line 18 and a scanning line 21, the introduced overlapping region may cause an additional parasitic capacitance, thereby affecting working stability of the display substrate.

Figure 6:
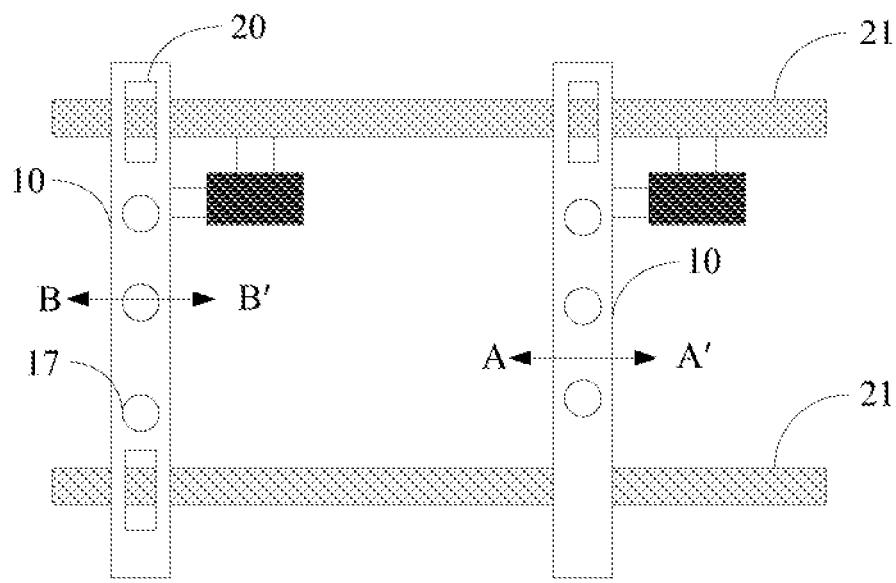
FIG. 6 schematically illustrates forming a hollowed-out pattern in a data line at a first projection region according to some embodiments of the present disclosure.
Figure 9:
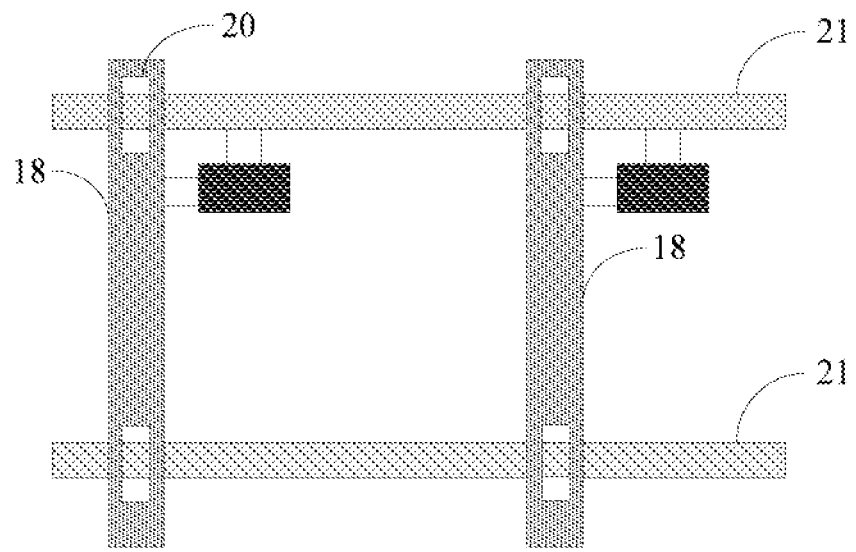
FIG. 9 schematically illustrates forming a hollowed-out pattern in a complementary data line at a second projection region according to some embodiments of the present disclosure.

In some embodiments, in order to prevent adverse effects on the working stability of the display substrate caused by the additional parasitic capacitance, in a case that the scanning line 21 and the data line 10 of the display substrate intersect with each other, as shown in FIG. 6 and FIG. 9, the method for manufacturing the display substrate further includes: patterning a first projection area of the scanning line 21 of the display substrate onto the data line 10 to form a hollowed-out pattern 20 in the data line 10 at the first projection region; and/or patterning a second projection area of the scanning line 21 of the display substrate onto the complementary data line 18 to form a hollowed-out pattern 20 in the complementary data line 18 at the second projection region.

In some embodiments, a step of forming the hollowed-out pattern 20 in the data line 10 at the first projection region through a patterning process includes: forming a photoresist on the data line 10; exposing and developing the photoresist to form a photoresist removing region and a photoresist remaining region, where the photoresist removing region corresponds to a hollowed-out region of the hollowed-out pattern 20, and the photoresist remaining region corresponds to a region except the photoresist removing region; etching the data line 10 in the hollowed-out region to form the hollowed-out pattern 20 in the data line 10 at the first projection region; and peeling remaining photoresist.

In some embodiments, a step of forming the hollowed-out pattern 20 in the complementary data line 18 at the second projection region through a patterning process is similar to the step of forming the hollowed-out pattern 20 in the data line 10 at the first projection region.

By forming the hollowed-out pattern 20 in the data line 10 at the first projection region and/or in the complementary data line 18 at the second projection region, an overlapping region of the data line 10 and the scanning line 21 is reduced, and an overlapping region of the complementary data line 18 and the scanning line 21 is reduced; accordingly, the parasitic capacitance between the data line 10 and the scanning line 21 and/or the parasitic capacitance between the complementary data line 18 and the scanning line 21 may be decreased, thereby ensuring working stability of the display substrate.

In some embodiments, a method for manufacturing a display substrate includes following steps to sequentially form structures as shown in FIG. 10, FIG. 11, FIG. 12, FIG. 13, FIG. 4, FIG. 5 and FIG. 14.

Figure 10:
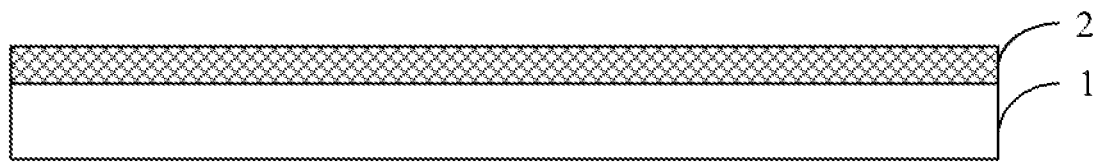
FIG. 10 schematically illustrates forming a buffering layer on a base substrate according to some embodiments of the present disclosure.

As shown in FIG. 10, a buffering layer 2 is formed on the base substrate 1.

In some embodiments, the base substrate may be a rigid base substrate or a flexible base substrate. In some embodiments, the rigid base substrate is made of glass. In some embodiments, the flexible base substrate is made of poly ethylene terephthalate (PET) or polyimide (PI).

As shown in FIG. 11, a transition pattern 19 for generating a complementary data line 18, and an active layer 3 of a thin film transistor are formed on the buffering layer 2 using poly-silicon (P—Si) through one patterning process.

As shown in FIG. 12, a first insulating layer 4 is formed on the base substrate 1 where the transition pattern 19 and the active layer 3 are formed; a gate electrode 5 is formed on the first insulating layer 4 through a patterning process; and the transition pattern 19, and a source electrode contact region 31 and a drain electrode contact region 32 of the active layer 3 are heavily doped to turn the transition pattern 19 into the complementary data line 18.

In a heavy doping process, the gate electrode 5 formed above the active layer 3 can partially shield the active layer 3, and a region of the active layer 3 shielded by the gate electrode 5 is a channel region of the active layer 3.

In some embodiments, the first insulating layer 4 is made of $SiO_2$. In some embodiments, the gate electrode 5 is made of Mo.

Figure 13:
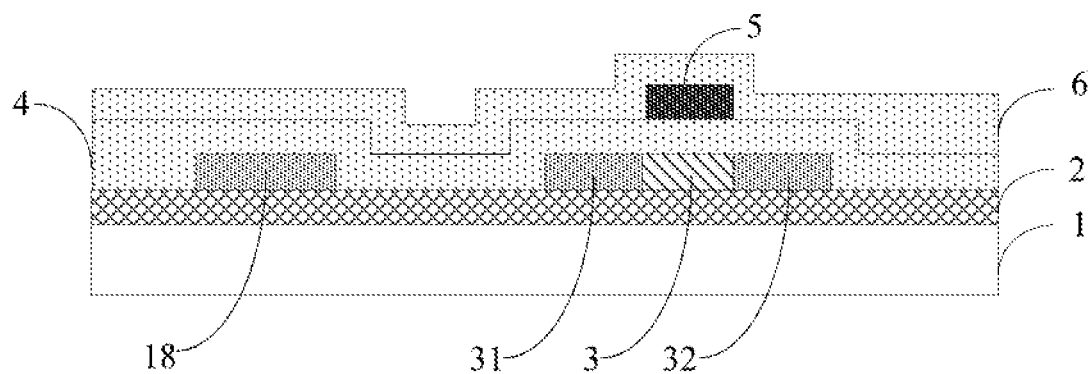
FIG. 13 schematically illustrates forming a second insulating layer on a base substrate according to some embodiments of the present disclosure.

As shown in FIG. 13, a second insulating layer 6 is formed on the doped base substrate 1.

In some embodiments, the second insulating layer 6 is made of $Si_3N_4$.

As shown in FIG. 4, a protective layer 7 is formed on the second insulating layer 6; and a via-hole 17, a source electrode via-hole 8 and a drain electrode via-hole 9 are formed through one patterning process. The via-hole 17, the source electrode via-hole 8 and the drain electrode via-hole 9 each penetrate through the first insulating layer 4, the second insulating layer 6 and the protective layer 7.

As shown in FIG. 5, a data line 10, a source electrode 11 and a drain electrode 12 are formed through one patterning process. The data line 10 is connected to the source electrode 11, the data line is connected to the complementary data line 18 via the via-hole 17, the source electrode 11 is connected to the source electrode contact region 31 of the active layer 3 via the source electrode via-hole 8 and the drain electrode 12 is connected to the drain electrode contact region 32 of the active layer 3 via the drain electrode via-hole 9.

Figure 14:
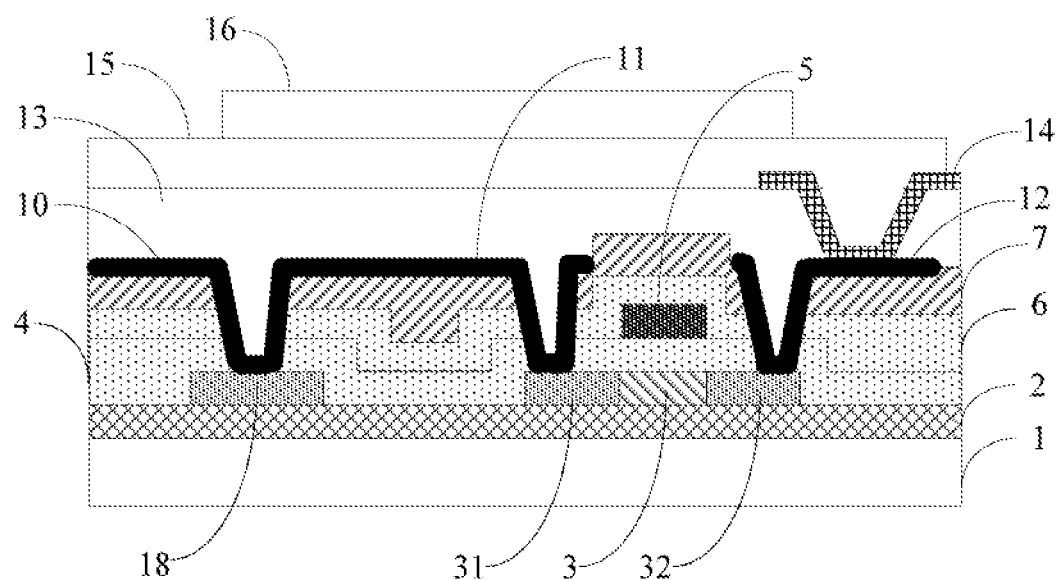
FIG. 14 is a schematic sectional view of a display substrate according to some embodiments of the present disclosure.

As shown in FIG. 14, a planarization layer 13, an anode 14, a pixel definition layer 15 and a spacer layer 16 are sequentially formed on the base substrate 1 where the data line 10, the source electrode 11 and the drain electrode 12 have been formed.

In some embodiments, the method for manufacturing the display substrate in the foregoing embodiments is applicable to a rigid display substrate. In some embodiments, the method for manufacturing the display substrate in the foregoing embodiments is applicable to a flexible display substrate. In some embodiments, the display substrate is an AMOLED display substrate.

A display substrate is provided according to some embodiments. The display substrate is manufactured by the method for manufacturing the display substrate according to the foregoing embodiments. The display substrate includes: a base substrate, a concave-convex structure arranged on the base substrate and a signal transmission line arranged on the concave-convex structure. The concave-convex structure extends in a direction identical to an extending direction of the signal transmission line.

The display substrate according to the embodiments includes the concave-convex structure extending in the direction identical to the extending direction of the signal transmission line, and the signal transmission line formed on the concave-convex structure. Since the signal transmission line is formed on the concave-convex structure, the signal transmission line has climbing portions. Since the climbing portions are also involved in signal transmission, a width of the signal transmission line is increased and a resistance of the signal transmission line is decreased, a voltage drop and a time delay formed when a signal is propagated along the data transmission line across a long distance are decreased, and consequently, abnormal image displaying at a far end of the display substrate is prevented.

Since the resistance of the signal transmission line is decreased, requirement on a driving capability of a driving chip in the display substrate is lowered, and a chip with a relatively low driving capability can satisfy operating needs of the display substrate, thereby reducing power consumption of the display substrate.

The concave-convex structure may have various structures.

In some embodiments, as shown in FIG. 4, the display substrate further includes an insulating layer. The concave-convex structure is a via-hole 17 penetrating through the insulating layer. The signal transmission line is on the insulating layer.

To ensure working stability of the display substrate, an insulating layer is arranged between adjacent film layers of the display substrate. The concave-convex structure includes via-hole 17 penetrating the insulating layer, so the width of the signal transmission line formed in the via-hole 17 is increased. In addition, the concave-convex structure may be formed through a simple process, which decreases complexity of manufacturing process of the display substrate.

In some embodiments, as shown in FIG. 5, the signal transmission line includes a data line 10. In a case that the signal transmission line is the data line 10, the display substrate further includes a complementary data line 18 having an extending direction identical to that of the data line 10. An orthographic projection of the complementary data line 18 onto the base substrate 1 at least partially overlaps an orthographic projection of the data line 10 onto the base substrate 1. The complementary data line 18 is connected to the data line 10 via the via-hole 17.

By arranging the complementary data line 18 in the display substrate, the complementary data line 18 and the data line 10 may form a parallel-connected structure. A data signal may be transmitted on the parallel-connected structure. With such parallel-connected structure, the resistance of the data line 10 is decreased, and the data signal can still be transmitted on the complementary data line 18 in a case that the data line 10 cracks (Data Open), thereby maintaining stable working of the display substrate.

In some embodiments, when Data Gate short occurs between the data me and the gate electrode, a portion of the data line 10 involved in the short circuit may be cut off, and the data signal may be transmitted via the complementary data line 18, thereby improving the production yield of the display substrates.

In some embodiments, the display substrate further includes an active layer 3 of a thin film transistor, which is arranged in a layer identical to the complementary data line 18. The complementary data line 18, and a source electrode contact region 31 and a drain electrode contact region 32 of the active layer 3 are all heavily doped polysilicon thin film layers.

By arranging the complementary data line 18 in the same layer as the active layer 3, the complementary data line 18 and the active layer 3 may be formed through one patterning process.

In some embodiments, a polysilicon layer is made of a polysilicon material, and the polysilicon layer is patterned to form the active layer 3 of the thin film transistor and a transition pattern 19 for generating the complementary data line 18. Since the conductivity of the polysilicon material is poor, the transition pattern 19, and the source electrode contact region 31 and the drain electrode contact region 32 of the active layer 3 are heavily doped, such that the complementary data line 18 formed tiller doping, and the source electrode contact region 31 and the drain electrode contact region 32 of the active layer 3 each has a good conductivity.

In some embodiments, as shown in FIG. 5, the display substrate further includes a source electrode via-hole 8 and a drain electrode via-hole 9 each penetrating through the insulating layer, and a source electrode 11 and a drain electrode 12 arranged in a layer identical to the data line 10. The source electrode 11 is connected to the source electrode contact region 31 via the source electrode via-hole 8, and the drain electrode 12 is connected to the drain electrode contact region 32 via the drain electrode via-hole 9.

In the display substrate, the via-hole 17 and the source electrode via-hole 8 and the drain electrode via-hole 9 penetrate an identical insulating layer, the via-hole 17, and the source electrode via-hole 8 and the drain electrode via-hole 9 may be formed through one patterning process. The data line 10, the source electrode 11 and the drain electrode 12 may be formed through one patterning process. The data line 10 may be connected to the complementary data line 18 via the via-hole 17, the source electrode 11 may be connected to the source electrode contact region 31 via the source electrode via-hole 8, and the drain electrode 12 may be connected to the drain electrode contact region 32 via the drain electrode via-hole 9.

In the display substrate according to the embodiments, the complementary data line 18 and the active layer 3 of the thin film transistor are formed through one patterning process, the via-hole 17 and the source electrode via-hole 8 and the drain electrode via-hole 9 can be formed through one patterning process, the data line 10 and the source electrode 11 and the drain electrode 12 of the thin film transistor can be formed through one patterning process. Hence, a parallel-connected structure of the data line 10 and the complementary data line 18 is manufactured in the display substrate according to the embodiments without increasing the quantity of patterning processes and the production cost. With such parallel-connected structure, the resistance of the data line 10 is decreased; in a case that the data line 10 cracks (Data Open), the data signal still can be transmitted on the complementary data line 18; and a short circuit (Data Gate short) formed between the data line and the gate electrode may be recovered by cutting off the data line 10 involved in the short circuit, thereby improving the yield of the product.

In some embodiments, a scanning line 21 and the data line 10 in the display substrate are arranged in an intersecting manner. As shown in FIG. 6, the scanning line 21 may project a first projection region on the data line 10 and a hollowed-out pattern 20 is formed in the data line 10 at the first projection region; and/or, as shown in FIG. 9, the scanning line 21 may project a second projection region on the complementary data line 18 and a hollowed-out pattern 20 is formed in the complementary data line 18 at the second projection region.

By generating the hollowed-out pattern 20 in the data line 10 at the first projection region and/or in the complementary data line 18 at the second projection region, an overlapping region of the data line 10 and the scanning line 21 is reduced and/or an overlapping region of the complementary data line 18 and the scanning line 21 is reduced; accordingly, a parasitic capacitance between the data line 10 and the scanning line 21 in the first projection region and/or a parasitic capacitance between the complementary data line 18 and the scanning line 21 in the second projection region may be decreased, thereby ensuring working stability of the display substrate.

A display device is provided according to some embodiments, including the display substrate according to the foregoing embodiments.

Under the premise of not introducing additional patterning process, in the above-described display substrate, the resistance of the signal transmission line may be reduced; in addition, in a case that the signal transmission line is the data line, a parallel-connected structure of two data lines may be achieved by forming the complementary data line, thereby solving problems of Data Open and Data Gate short and improving the yield of the display substrate. The display device provided in the embodiments includes the display substrate and so has the above-described beneficial effects similarly.

Terms such as "first" and "second" in the present disclosure do not indicate any order, quantity or importance, and they are merely used to distinguish different components. An element or object before terms such as "include" and "comprise" covers an element or object and an equivalent after such terms, but other elements and objects are not excluded. Terms such as "connected" and "coupled" are not limited to physical or mechanical connections, and they may include electrical connections whether direct or indirect connections.

In a case that an element such as a layer, a film, a region or a substrate is called to be "on" or "below" another element, the element may be directly on or below the another element or an intermediate element may be provided therebetween.

What is claimed is:
1. A display substrate, comprising:
a base substrate;
a concave-convex structure arranged on the base substrate; and
a signal transmission line arranged on the concave-convex structure,
wherein an extending direction of the concave-convex structure is the same as an extending direction of the signal transmission line,
wherein the display substrate further comprises an insulating layer arranged on the base substrate, and a complementary data line having a same extending direction as an extending direction of a data line, wherein the signal transmission line comprises the data line, wherein the concave-convex structure comprises a via-hole penetrating the insulating layer, wherein an orthographic projection of the complementary data line onto the base substrate at least partially overlaps an orthographic projection of the data line onto the base substrate, and the complementary data line is connected to the data line via the via-hole, and wherein the display substrate further comprises a scanning line, there is a projection region of the scanning line projected onto the complementary data line, the projection region is a region where an orthographic projection of the scanning line onto the base substrate overlaps the orthographic projection of the complementary data line onto the base substrate, and a hollowed-out pattern is arranged in the complementary data line at the projection region.

2. The display substrate according to claim 1, wherein the signal transmission line is located on the insulating layer.

3. The display substrate according to claim 1, further comprising an active layer of a thin film transistor, wherein the active layer is arranged in a same layer with the complementary data line, and each of the complementary data line, a source electrode contact region of the active layer and a drain electrode contact region of the active layer comprises polysilicon that is heavily doped.

4. The display substrate according to claim 1, wherein the scanning line intersects with the data line, there is another projection region of the scanning line projected onto the data line, the another projection region is a region where the orthographic projection of the scanning line onto the base substrate overlaps the orthographic projection of the data line onto the base substrate, and another hollowed-out pattern is arranged in the data line at the another projection region.

5. The display substrate according to claim 1, further comprising: a source electrode and a drain electrode of a thin film transistor arranged in a same layer as the data line, wherein the data line, the source electrode and the drain electrode are formed through one patterning process.

6. The display substrate according to claim 1, wherein the insulating layer is further provided with a source electrode via-hole and a drain electrode via-hole, and the via-hole, the source electrode via-hole and the drain electrode via-hole are formed through one patterning process.

* * * * *